United States Patent [19]

Fjelstad

[11] Patent Number: 4,482,445
[45] Date of Patent: Nov. 13, 1984

[54] METHODS AND APPARATUS FOR ELECTROCHEMICALLY DEBURRING PERFORATE METALLIC CLAD DIELECTRIC LAMINATES

[75] Inventor: Joseph C. Fjelstad, Bellevue, Wash.

[73] Assignee: The Boeing Company, Seattle, Wash.

[21] Appl. No.: 350,425

[22] Filed: Feb. 22, 1982

[51] Int. Cl.³ ............................ C25F 3/14; C25F 7/00
[52] U.S. Cl. ............................. 204/129.43; 204/211;
204/224 M; 204/228; 204/297 W; 204/DIG. 7;
204/225
[58] Field of Search ................ 204/129.43, 129.55,
204/224 M, 224 R, 225, 228, 231, 237, 273,
204/297 W, DIG. 7, DIG. 8, DIG. 9, 206, 211

[56] References Cited

U.S. PATENT DOCUMENTS

| 2,559,263 | 7/1951 | Smith | 204/129.43 |
| 2,590,927 | 4/1952 | Brandt et al. | 204/129.9 |
| 2,695,872 | 11/1954 | Espy | 204/129.43 |
| 2,784,155 | 3/1957 | Heinrich | 204/224 R X |
| 2,850,444 | 9/1958 | Armstrong et al. | 204/129.43 X |
| 2,890,159 | 6/1959 | Amaya | 204/129.43 |
| 2,904,479 | 9/1959 | McCord et al. | 204/129.8 X |
| 2,963,411 | 12/1960 | Scott | 204/129.43 X |
| 3,027,310 | 3/1962 | Lane | 204/129.8 X |
| 3,071,521 | 1/1963 | Ehrhart | 204/224 R X |
| 3,424,667 | 1/1969 | Frank | 204/237 |
| 3,468,775 | 9/1969 | Lanning et al. | 204/129.43 X |
| 3,705,843 | 12/1972 | Sickels | 204/129.5 |
| 3,745,105 | 7/1973 | Kosowsky et al. | 204/224 R |
| 4,202,739 | 5/1980 | Csakvary et al. | 204/129.35 |

FOREIGN PATENT DOCUMENTS 5687691 7/1981 Japan ........................ 204/DIG. 9

Primary Examiner—Howard S. Williams
Assistant Examiner—T. L. Williams
Attorney, Agent, or Firm—Hughes, Barnard & Cassidy

[57] ABSTRACT

Methods and apparatus for electrochemically deburring perforate metallic clad dielectric laminates such, for example, as laminated printed circuit boards (PCBs) or printed wiring boards (PWBs) and similar machined and fabricated laminated dielectric parts; and, more specifically, methods and apparatus for removing burrs formed during drilling, punching and similar machining operations for forming holes in a workpiece and wherein the conductive path for current flow during the electrochemical deburring process extends through the thru-hole perforations formed in the workpiece being deburred so as to concentrate current densities and preferential electrochemical attack in the regions of the clad at the peripheral edges of the thru-hole perforations in the clad dielectric laminate.

64 Claims, 12 Drawing Figures

METHODS AND APPARATUS FOR ELECTROCHEMICALLY DEBURRING PERFORATE METALLIC CLAD DIELECTRIC LAMINATES

BACKGROUND OF THE INVENTION

1. Field of the Invention

The present invention relates, in general, to a system for electrochemically deburring perforate metallic clad dielectric laminates such, for example, as printed circuit boards (PCBs) or printed wiring boards (PWBs) and the like; and, more particularly, to methods and apparatus wherein the metallic clad dielectric laminate to be deburred is immersed within a suitable conventional electrolyte solution, one external metallic conductive layer or clad on the laminate is coupled to the positive terminal of a suitable power supply so that the clad comprises the anode in an anodic deburring process, and one or more conductive paths are established through the electrolyte solution passing through the thru-hole perforation(s) in the dielectric laminate between the anode and a suitable cathode, thereby concentrating current density at those portions of the anodic clad in the regions of the peripheral edges of the thru-hole perforations in the dielectric laminate and preferentially removing burrs, protrusions and irregularities therefrom to form a smooth rounded edge in the anodic metal clad surrounding each hole.

Those skilled in the art have long recognized that in conventional electroplating operations, edges, protrusions, sharp angles and the like will be preferentially plated—generally an undesirable phenomenon, particularly when dealing with printed circuit boards or printed wiring boards and the like—and, this fact has resulted in many sophisticated techniques and different types of apparatus for minimizing the preferential plating problem. On the other hand, electrochemical deburring constitutes precisely the opposite process—i.e., deplating as contrasted with plating—and takes advantage of such negative phenomenon. That is to say, in a deburring operation, the desired end result is the removal of the burrs or other protrusions while simultaneously minimizing deplating of relatively smooth plated areas; and, consequently it is highly desirable that the drilling burrs and similar protrusions function as sites for preferential electrochemical attack. At the same time, however, it is also desirable that the deburring system be such that only minimal attack occurs at the relatively smooth portions of the clad dielectric laminate being worked upon.

2. Prior Art

In general, printed circuit boards or printed wiring boards and the like commonly comprise plated or clad dielectric laminates having at least one, and normally two, external relatively thin spaced layers or clads of copper—e.g., clads on the order of from about 1.3 mils thick to as thin as perhaps 0.16 mil—with an intermediate non-conductive dielectric layer commonly formed of a fiberglass/epoxy material which is generally on the order of about 59 mils in thickness. Such workpieces are commonly drilled to form a multiplicity of thru-hole perforations in each metal clad dielectric laminate for mounting of conventional electronic components and/or accommodating electrical leads or the like. Unfortunately, such drilling and similar machining operations commonly cause the formation of burrs and similar irregularities in the region of the hole edges, which burrs are highly undesirable.

Prior to the advent of the present invention, the most commonly employed expedient for deburring printed circuit boards or printed wiring boards and the like involved a mechanical abrasive operation such, for example, as sanding (both manually and automatically), spinning employing abrasive roller-type machines (both oscillating and non-oscillating types), and pressure blast equipment wherein an abrasive is sprayed under high pressure against the board to remove the burrs. The particular deburring equipment employed will generally vary as a function of the normal burr height encountered—a dimension that can range from a few ten-thousandths of an inch to several thousandths of an inch depending on the condition of the drill and drilling parameters. The most popular choice has heretofore been the oscillating, spinning, abrasive roller-type machine. These machines perform an adequate job of deburring while radiusing the hole edges to a limited degree. Often, however, burrs are folded over into the hole and, if not removed, such folded over burrs can cause significant problems during subsequent processing operations. For example one of the principal problems is the reduction of the finished hole size due to nodule growth at the site of the folded over burr. When plating, other recognized problems associated with burrs, especially burrs which have been turned over, include entrapment of processing solution and/or air bubbles. Either of these conditions can cause significant weakening of the thru-hole copper plating at its most vulnerable point—viz., the corner of the clad surrounding the peripheral edge of the thru-hole perforation.

It is further well-known to those skilled in the art that the effectiveness of mechanical deburring operations is also fairly operator-dependent. That is, the operator is relied upon to make adjustments for varying board thicknesses, to stagger parts through conveyerized feeds, and to dress the wheels as they become out of balance or wear unevenly. Moreover, such equipment is capital-intensive and disadvantageous in that it is commonly limited as to the dimensions of the part that can be accepted and processed. Thus, such systems are commonly constrained to operate with piece parts having a 24" maximum width, a 6" to 8" minimum width, and a minimum thickness of about 0.010".

Another known conventional approach for deburring perforate metallic clad dielectric laminates involves a purely chemical deburring process such, for example, as a process described by H. V. Connely and B. E. Rothschild of the Autonetics Division of Rockwell International; a process employing a sulfuric-peroxide solution to chemically remove burrs.

Electrochemical deburring, etching and/or polishing of solid piece parts have, of course, long been recognized in the art. One disclosure of interest is that found in Brandt et al U.S. Pat. No. 2,590,927 wherein the patentees disclose an alternating current process for deburring the metal portion of metal/insulation laminations in magnetic core ends. Similar disclosures are found in Smith U.S. Pat. No. 2,559,263 (an electropolishing process); Armstrong et al U.S. Pat. No. 2,850,444, and Amaya U.S. Pat. No. 2,890,159 (etching of semi-conductor surfaces); McCord et al U.S. Pat. No. 2,904,479 (a rare metal polishing process utilizing a near-neutral ammonium fluoride solution); Scott U.S. Pat. No. 2,963,411 (a process for exposing and etching defects comprising shorts in p-n-type junctions); Lane U.S. Pat. No. 3,027,310 (a metal cleaning operation involving separate baths); and, Lanning et al U.S. Pat. No. 3,468,775 (an electrochemical machining process for removing burrs from a conductive workpiece).

One problem inherent with electrochemical deplating processes has been the undesired channeling effect that occurs in the metallic portions of the workpiece as a result of off-gasing and/or the movement of air bubbles over the surface of the workpiece during a deplating operation.

Yet, notwithstanding the extensive development of the electroplating and electrochemical polishing, etching, deburring and/or other deplating arts, virtually the only commercially employed process for removing burrs from perforate metallic clad dielectric laminates such as PCBs or PWBs has been the foregoing mechanical abrading processes hereinabove described—this despite the known disadvantages of such systems.

SUMMARY OF THE INVENTION

Accordingly, it is a general aim of the present invention to provide simple, yet highly effective, apparatus and processes for electrochemically deburring perforate metallic clad dielectric laminates which overcome the disadvantages inherent with mechanical abrading systems and which ensure uniform substantially complete removal of burrs and similar protrusions and/or irregularities from the hole edges of such laminates while, at the same time, the chances of turning such burrs and/or protrusions over and into the perforations are substantially eliminated.

In one of its important aspects, it is an object of the invention to provide an electrochemical deburring system which is highly flexible, can be successfully employed with a wide range of different thickness copper clad laminations on dielectric laminates, is not limited in application to laminates within particular size ranges, and which permits of ease in shifting from one type and size of workpiece to another without requiring any operator adjustment of system parameters.

A further objective of the invention is the provision of an electrochemical deburring system of the foregoing type suitable for use in deburring perforate metal clad dielectric laminates which takes advantage of the thru-hole perforations passing through the dielectric material to complete conductive current paths in an anodic electrochemical deburring process so as to concentrate current density at the edges of the anodic clad surrounding the holes to thereby preferentially attack burrs and/or similar irregularities located at such sites. In this connection, it is an ancillary objective of the invention to provide a process for uniformly removing metal clad from the peripheral lips surrounding thru-hole perforations extending through a perforate clad dielectric laminate so as to form smooth rounded hole edges, thereby diffusing stresses normally concentrated at the hole edges and minimizing "corner crack" failure of the type typically encountered with printed circuit or wiring boards and similar perforate metal clad dielectric laminates.

A further objective of the invention is the provision of effective deburring processes and equipment which are competitive in terms of process time and cost with conventional mechanical abrading processes and/or equipment, yet which require only minimum investment in equipment and fixtures.

In one of its more detailed aspects, it is an object of the invention to take advantage of the unique configuration of a perforate metal clad dielectric laminate of the type having a non-conductive dielectric layer sandwiched between a pair of spaced parallel conductive layers and wherein the pair of conductive layers are alternately coupled to a positive electric charge—i.e., the pair of conductive metal external laminations alternately are rendered anodic—and wherein conductive paths are completed through the perforations formed in the dielectric material so as to alternately and preferentially attack the clad edges surrounding the holes on each side of the dielectric laminate. In one specific illustrative embodiment of the invention, this is accomplished by coupling the leads of an alternating current power source to opposite sides of a drilled piece of copper clad laminate having a dielectric central lamination so that when one copper lamination is anodic in character, the other is cathodic in character and wherein the anodic/cathodic states are rapidly alternated so as to provide an alternating current flow path through the perforations in the dielectric laminate for preferentially attacking the hole edges in the two spaced copper clad layers alternately.

In the foregoing alternating current mode it should be pointed out that because the solution is at first essentially devoid of platable metal ions that would be available for deposition at the opposite cathode, essentially no metal build-up occurs. The anodic efficiency, however, remains intact. As metal ions build up in solution from the dissolution of the copper clad, the anodic reaction retains its higher efficiency; thus the process still favors burr removal by anodic dissolution.

As a result of attaining the foregoing objectives of the invention, and when employing the invention to deburr printed circuit or wiring boards or the like, it is possible to orient the dielectric laminate in a horizontal plane within the electrolyte solution as contrasted with a vertical plane, thereby ensuring that off-gasing and/or air bubbles do not cause channeling of the copper clad workpiece.

DESCRIPTION OF THE DRAWINGS

These and other objects and advantages of the present invention will become more readily apparent upon reading the following detailed description and upon reference to the attached drawings in which.

Figure 1:
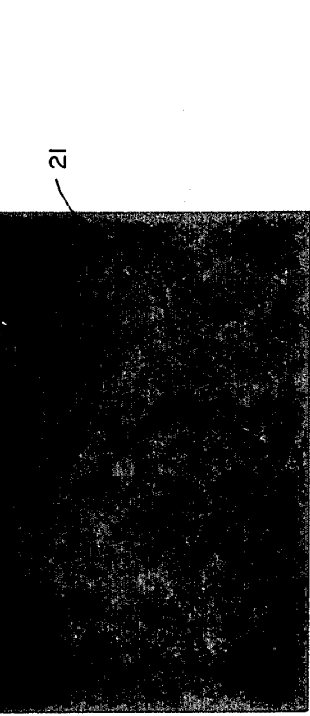
FIG. 1 is a highly magnified scanning electron micrograph, here illustrating a portion of a conventional perforate metallic clad dielectric laminate, and illustrating particularly the irregularities formed in the peripheral edge of the metallic clad during the course of a drilling or similar machining operation.

While the invention is susceptible of various modifications and alternative forms, specific embodiments thereof have been shown by way of example in the drawings and will herein be described in detail. It should be understood, however, that it is not intended to limit the invention to the particular forms disclosed but, on the contrary, the intention is to cover all modifications, equivalents and alternatives falling within the spirit and scope of the invention as expressed in the appended claims.

DETAILED DESCRIPTION

Figure 2:
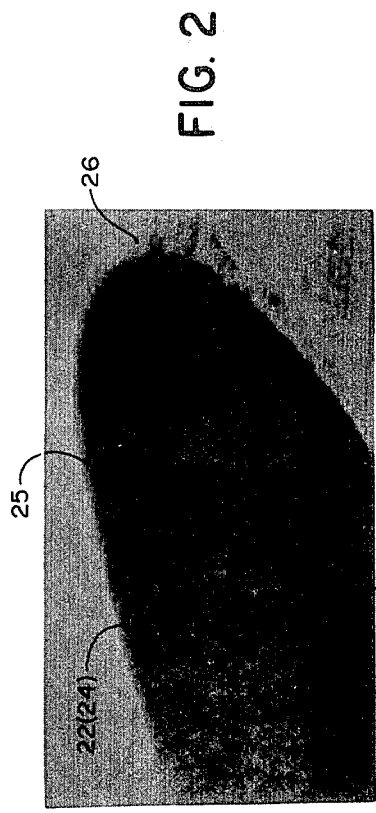
FIG. 2 is a highly enlarged scanning electron micrograph illustrating greater details of the workpiece particularly within the region of the inset shown in FIG. 1.
Figure 3:
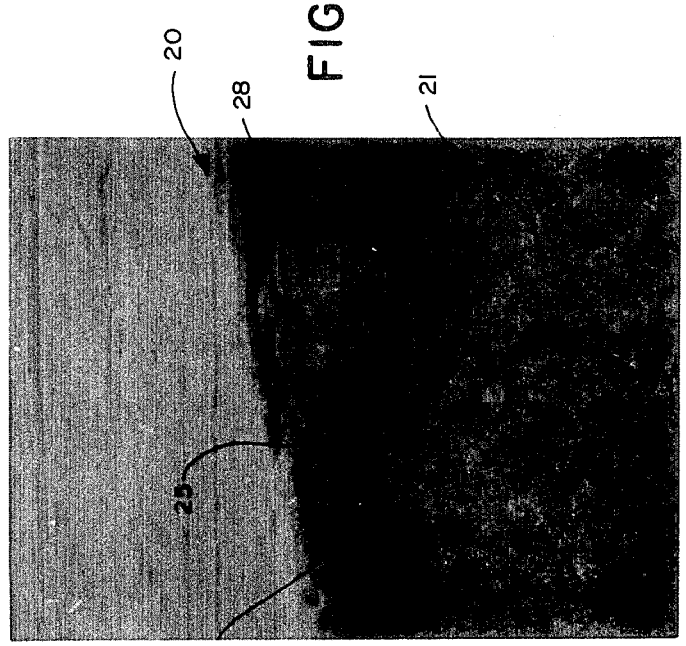
FIG. 3 is a still more highly enlarged scanning electron micrograph illustrating particularly the presence of a turned over burr within the peripheral edge of the metal clad on a dielectric laminate following a mechanical deburring operation.

Turning now to the drawings, and with particular reference first to FIGS. 1 and 2, a portion of a perforate metal clad dielectric laminate, generally indicated at 20, has been shown in a scanning electron micrograph taken at an oblique angle to the plane of the laminate. It will, of course, be appreciated that the micrographs reproduced herein as FIGS. 1 through 5 inclusive are all highly enlarged since it will be understood that the perforations shown are generally quite small, commonly being on the order of about 0.05" in diameter, or even less. As is conventional with this type of laminate which is commonly employed as a printed wiring board or the like, the laminate comprises a central lamination 21 of dielectric material—e.g., a fiberglass/epoxy material or the like—having a pair of outer spaced conductive copper clads 22, 24 (only the conductive clad 22 being visible in the photographs of FIGS. 1–7). Such devices are commonly provided with a plurality of thru-hole perforations—one such perforation being indicated at 25 in FIGS. 1 and 2—for the purpose of accommodating electrical leads (not shown). Such holes or perforations 25 may be formed by any conventional machining process, although commonly they are formed by drilling. As a result of the machining process, the conductive metal clad defining the peripheral edge of each hole 25 is often characterized by the presence of numerous metal protrusions, burrs or similar irregularities, generally indicated at 26; and, the problem can be, and is, exacerbated when the metal clad is extremely thin—say, for example, on the order of 0.16 mil. Such protrusions or irregularities 26 are highly disadvantageous and, consequently, some provision must be made for removal thereof. It is this type of problem which has commonly been "solved" in the prior art by mechanically abrading the edges of the holes 25—for example, with the use of spinning equipment or other types of abrasive equipment. But, as previously indicated, such equipment is not only expensive and requires constant adjustment and care by the operator but, moreover, such equipment will commonly turn or fold a burr or similar protrusion over and into the hole 25, as best indicated at 28 in FIG. 3 (a micrograph taken following a mechanical deburring operation), rather than abrasively removing the undesired protrusion. This can, of course, create significant problems such as entrapment of process solutions and/or air, and consequent dragover contamination of subsequent processing solutions. And, of course, such turned over burrs 28 can also serve as a location for nodule growth, and serve to reduce hole size.

Figure 5:
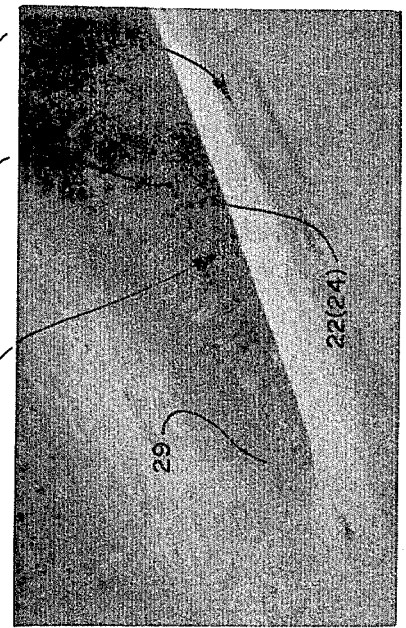
FIG. 5 is a highly enlarged scanning electron micrograph illustrating that portion of the hole depicted within the inset in FIG. 4 and illustrating particularly the smoothly curved rounded edge which is formed in the metal clad uniformly about the periphery of the hole.
Figure 6:
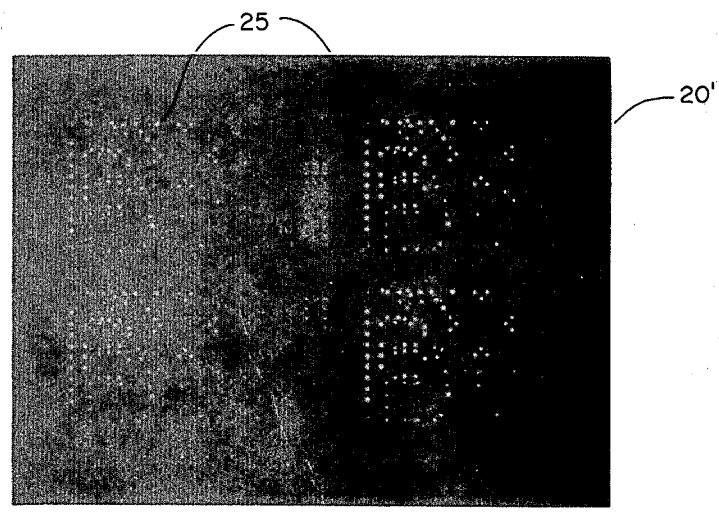
FIG. 6 is a photograph of a conventional printed wiring board prior to an electrochemical deburring operation in accordance with the present invention.
Figure 7:
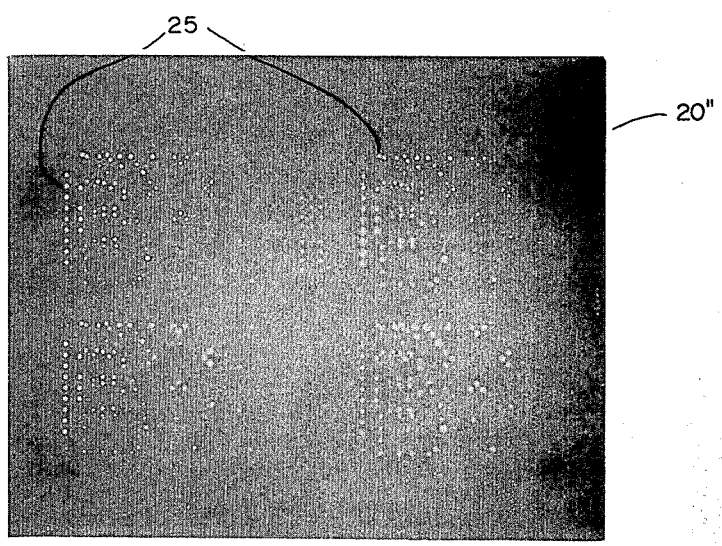
FIG. 7 is a photograph similar to FIG. 6, but here illustrating the printed wiring board following an electrochemical deburring process in accordance with the present invention.

It is the foregoing type of problem which the present invention has successfully obviated. Thus, referring to FIGS. 4 and 5 conjointly, it will be observed that the electrochemical deburring process of the present invention results in controlled substantially uniform removal of copper clad about the peripheral edges of the thru-hole perforations 25, producing a smooth generally rounded hole edge 29 about the entire hole periphery and, of course, about the peripheries of all other thru-hole perforations (not shown) formed in the metallic clad dielectric laminate 20. This phenomenon is perhaps best observed by comparison of the two printed wiring boards 20' and 20" respectively illustrated in FIGS. 6 and 7, where FIG. 6 depicts the appearance of the printed wiring board 20' prior to electrochemical deburring in accordance with the invention, while FIG. 7 is illustrative of the printed wiring board 20" after electrochemical deburring pursuant to the invention. Thus, close inspection of FIG. 6 reveals that the thru-hole perforations 25 present a generally irregular appearance with no highlighting of the hole edges, while in FIG. 7, the peripheral edges of the thru-holes appear to be highlighted and characterized by their regular uniform smooth appearance.

Figure 8:
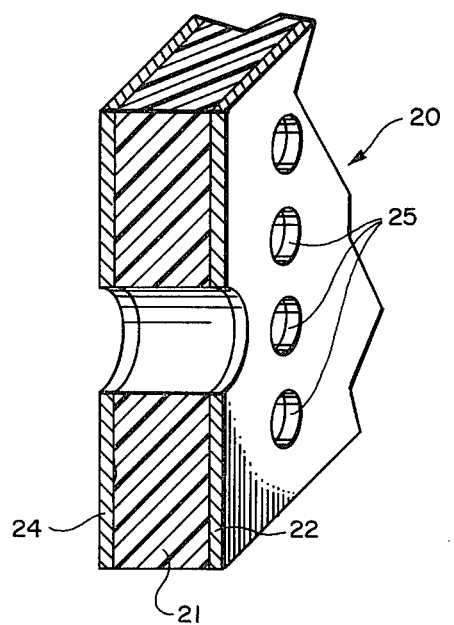
FIG. 8 is a highly enlarged fragmentary perspective view, partly in section, illustrating a portion of a conventional perforate metal clad dielectric laminate—e.g., a printed wiring board—of the type having a central fiberglass/epoxy or similar non-conductive dielectric lamination and a pair of outer conductive copper clads applied on opposite surfaces of the central dielectric lamination with the overall laminate having a plurality of thru-hole perforations formed therein.

Referring next to FIG. 8, there has been illustrated in greatly enlarged form, and with the various components shown in dimensionally exaggerated and disproportionate size for purposes of clarity, a portion of a conventional perforate metal clad dielectric laminate 20 here having a central dielectric lamination 21 formed of fiberglass/epoxy or similar non-conductive material sandwiched between a pair of spaced external copper clad surfaces 22, 24, and with the laminate 20 having a plurality of perforations in the form of thru-holes 25 passing entirely through all layers of the laminate. As is conventional in this type of art, the dielectric laminate 20 or circuit board commonly consists of 1.3 mils (0.0013") of copper clad 22, 24—i.e., about 1 oz. cu/ft$^2$—although the thickness of copper clad materials 22, 24 will commonly range from ¼ oz. cu/ft$^2$ to on the order of 2 oz. cu/ft$^2$. Indeed, the invention finds particularly advantageous use when working with the relatively recent thin clad laminates where the copper foil or clad may be as thin as 0.16 mil, a thickness which is particularly difficult to handle when attempting to use the more conventional mechanical abrading techniques and equipment.

In accordance with one of the important aspects of the present invention, an electrochemical deburring system has been provided which takes advantage of the thru-holes formed in a perforate metal clad dielectric laminate for establishing a portion of the conductive path during the anodic deplating process and wherein only one metal clad on the laminate is permitted to function as an anode at any given period of time, there being a suitable cathode disposed on the opposite side of the non-conductive dielectric laminate with respect to the active anodic clad, thereby establishing an anode/cathode conductive path passing through the electrolyte solution within the thru-hole perforations so as to concentrate current density at the desired point of preferential electrochemical attack—viz., the peripheral edges or lips of the active anodic metal clad surrounding the thru-holes. In the practice of one exemplary form of the invention, and as best illustrated diagrammatically in FIG. 9, an electrochemical deburring system, generally indicated at 30, has been provided wherein a conventional perforate metallic clad dielectric laminate 20 of the type shown in greater detail in FIG. 8—e.g., a printed wiring board—is supported by rack means, generally indicated at 31, having a pair of conductors 32, 34 fixedly secured with respect to one another, but electrically spaced apart and isolated from one another by means of any suitable non-conductive body 35 formed of plastic or other suitable material which is not subject to attack by the electrolyte solution used in the electrochemical deburring process.

Figure 9:
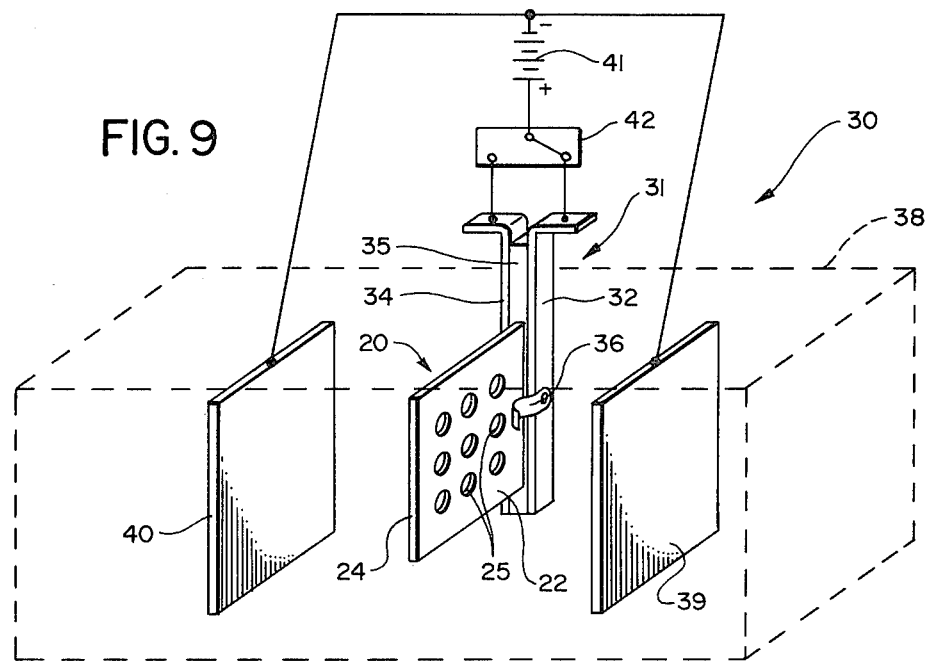
FIG. 9 is a highly simplified diagrammatic perspective view, partly in block-and-line form, here illustrating one exemplary system for practicing the process of the present invention when utilizing a battery or other suitable source of direct current.

To firmly, but releasably, grip the laminate 20, the conductors 32, 34 are each provided with conductive spring-type mounting clips, one of which is depicted at 36 in FIG. 9 as being attached to conductor 32, it being understood that an identical clip (not shown) would be provided on conductor 34 with the two clips being biased toward one another so as to define a nip into which the laminate 20 may be inserted and firmly held by spring action. Thus, the arrangement is such that an anodic conductive path is established from the active one of the conductors 32, 34 through the conductive clips 36 to respective ones of the spaced conductive clad surfaces 22, 24 on the perforate metallic clad dielectric laminate 20. Of course, those skilled in the art will appreciate that other than spring-type clips may be employed such, merely by way of example, as rigid spaced conductive clamps having one or more adjustable thumb screws (not shown).

In carrying out this exemplary form of the invention, the rack 31, together with the perforate metallic clad dielectric laminate 20 releasably clamped thereto, is positioned within a suitable tank, indicated at 38 in broken lines, containing a conventional electrolyte solution (not shown)—for example, a sodium tripolyphosphate-based electrolyte buffered with boric acid to a pH preferably in the range of 7.0 to 7.5. A pair of cathodes 39, 40 are respectively positioned on opposite sides of the perforate metal clad dielectric laminate 20 and coupled to the negative terminal of any conventional direct current power source, here illustrated diagrammatically as a battery 41. In keeping with this form of the invention, the positive terminal of the direct current power source 41 is adapted to be connected to one only of the conductors 32, 34 at any given point in time by means of, for example, a conventional power switch diagrammatically illustrated at 42 in FIG. 9.

In operation of the exemplary electrochemical deburring system 30 shown in FIG. 9, and with the power operated switch 42 in the position shown, both cathodes 39, 40 are active, but only the conductor 32 is active; and, consequently, the conductive metal clad 22 is electrically connected through spring contact 36 to the active conductor 32 and, therefore, is actively functioning as an anode while the metallic conductive clad 24 is electrically isolated from the system. In this condition, a first conductive path is completed through the electrolyte solution in tank 38 between the active anodic clad 22 and the proximate cathode 39 with current density being greater at the relatively sharp hole edges and, particularly, at any raised burrs or protrusions, than at the smooth central regions of the clad 22, thereby resulting in preferential attack at such hole edges and at any burrs or raised protrusions associated with clad 22, particularly those in the regions of the clad defining the edges or peripheral lips of the holes 25. At the same time, and in keeping with the important aspects of the invention, a second current path is completed through the electrolyte solution in tank 38 between the active anodic clad 22 and the remote cathode 40—i.e., the cathode on the opposite side of the dielectric laminate 20 which is proximate to the electrically isolated clad 24—with such second conductive path extending through the thru-hole perforations 25 in the laminate 20, thereby effectively concentrating current density at the desired point of preferential attack, viz., the peripheral edges of the anodic clad 22 surrounding the thru-holes 25.

Thus, by merely activating the power switch 42, the conductors 32, 34 are alternately activated, thereby alternately rendering the conductive metal clads 22, 24 anodic and alternately shifting the site of high current density and preferential attack from the clad 22 at the peripheral edges or lips on one end of the thru-holes 25 to the clad 24 at the peripheral edges or lips on the opposite end of the thru-holes 25. As a consequence, there is no need to rerack the perforate metallic clad dielectric laminate 20 in order to effectively and uniformly deburr the laminate while forming smooth rounded edges in the clads at both ends of the thru-holes 25.

Of course, those skilled in the art will appreciate that the exemplary form of the invention depicted in FIG. 9 has been illustrated diagrammatically with only a single rack 31 being positioned within tank 38 and with that rack containing only one perforate metal clad dielectric laminate or printed wiring board 20 mounted thereon. However, in commercial applications, it will be understood that a plurality of discrete independent perforate metallic clad dielectric laminates 20 may be mounted one above the other on each rack 31; and, indeed, the racks may be provided with a plurality of pairs of conductive spring clips 36 extending in both directions, thereby enabling a plurality of laminates 20 to be mounted on and project oppositely from both exposed sides of the central insulator spacer 35. Moreover, in the form of the invention here depicted and described above, it will be understood that while the spaced conductors 32, 34 and, therefore, the spaced clads 22, 24 are alternately activated and rendered anodic, both cathodes 39 and 40 are active at all times, resulting in the two distinct electrically conductive paths described above. However, those skilled in the art will readily appreciate that a second power switch (not shown) similar to that shown at 42 may be interposed between the negative terminal of the direct current power source 41 and the cathodes 39, 40 with the two switches being ganged or otherwise synchronously operated so as to ensure that when clad 22 is anodic, cathode 40 is active and cathode 39 inactive, and when clad 24 is anodic, cathode 39 is active and cathode 40 inactive; thereby providing a system wherein only a single current path is established at any given time with that path extending through the thru-holes 25 and concentrating current density and preferential attack at the desired location— viz., the peripheral edges of the clads surrounding the thru-holes 25.

Figure 4:
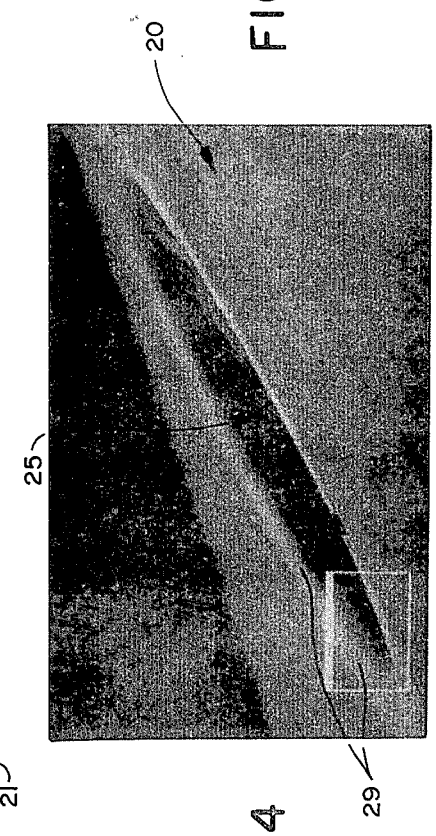
FIG. 4 is a scanning electron micrograph similar to FIG. 1, but here illustrating the peripheral edge of a hole in the conductive metal clad on a dielectric laminate following an electrochemical deburring process in accordance with the present invention.

As previously indicated, the particular electrolyte solution employed is not believed critical to the present invention and may be varied widely dependent upon the particular system requirements. With perforate copper clad dielectric laminate printed wiring boards of the type herein described, it has been ascertained that excellent results can be achieved when utilizing a sodium tripolyphosphate-based electrolyte solution. It has further been ascertained that low temperature operation results in polarization and oxidation, forming insoluble metal phosphates on the surfaces of the laminate 20. However, as temperature is increased, such undesired results disappear. Particularly excellent results have been attained when the temperature of the solution is maintained between about 120° F. and about 135° F. Moreover, it has also been ascertained that the pH of the solution should be maintained near neutral to prevent formation of undesired deposits on the laminate 20, with the preferred pH range being between about 7.0 to about 7.5. Since pH values tend to rise with use of the system, addition of phosphoric or boric acid is desirable for control purposes. Air agitation (not shown) is highly desirable to prevent channeling of evolved gases. In general, it has been found that the exemplary system 30 produces variable current densities ranging between about 160 and 200 amp/ft$^2$, with optimum results being obtained at current densities on the order of 180 amp/ft$^2$. The time required to obtain acceptable results varies with the thickness of the copper clad; but, with copper clad on the order of 1.3 mils in thickness, acceptable results have been obtained in about 45 seconds, or less. In further investigations it was discovered that the current density requirements could be effectively halved by having only the opposite cathode operative as opposed to the two active cathode configuration first described above—i.e., with only one cathode active and establishing a thru-hole conductive path effective current densities ranged between about 80 and 100 amp/ft$^2$, with a current density on the order of 90 amp/ft$^2$ being optimal. In all cases, the resulting electrochemically deburred products are characterized by the smooth, uniformly rounded peripheral edges in the clad as depicted in FIGS. 4 and 5, thereby substantially minimizing the problem of "corner crack" failure which has heretofore existed with this type of laminate. And, of course, those skilled in the art will appreciate that in printed wiring boards or the like of the type herein described, the presence of a single defect such as a "corner crack" or turned over burr which preferentially plates and reduces hole diameter to a useless dimension in just one thru-hole can, and normally will, result in rejection of the entire circuit board.

Figure 10:
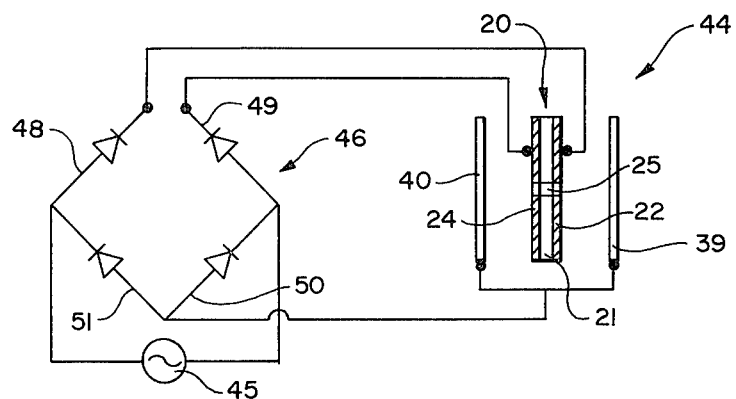
FIG. 10 is a diagrammatic schemmatic representation of a slightly modified embodiment of the invention here suitable for use with an alternating current power supply.

Turning now to FIG. 10, there has been illustrated a slightly modified form of the invention here comprising an electrochemical deburring system, generally indicated at 44, adapted to be employed in conjunction with a conventional alternating current power source 45. As here illustrated, the alternating current power source 45 is coupled to a bridge rectifier circuit, generally indicated at 46, having a first leg or branch 48 for conveying direct current to the metal clad 22 of a perforate metallic clad dielectric laminate 20 during one-half cycle, a second branch 49 for conducting direct current to metal clad 24 on the laminate 20 during the second half cycle, and branches 50, 51 for completing the circuit between cathodes 39, 40 and the alternating current power source 45. That is, the branches 48, 49 of the bridge rectifier circuit 46 are split so as to allow current to flow alternately to both sides or metal clads 22, 24 of the laminate at 60 cycles/second with the clads 22, 24 alternately being anodic during one-half cycle and electrically isolated during the successive half cycle. This effectively eliminates the need for mechanical switches. It has been found that pulsation of the current employing a system 44 of the exemplary type shown in FIG. 10 appears to provide a more even deburring effect, allowing the diffusion layer to relax between pulses. In this exemplary form of the invention, just as in the illustrative form heretofore described in connection with FIG. 9, both cathodes 39, 40 are active so that during each one-half cycle, two conductive current paths are established between the anodic clad 22 (or 24) and the two cathodes 39, 40, one of which passes through the electrolyte solution within the thru-hole perforations 25 formed in the laminate 20.

Figure 11:
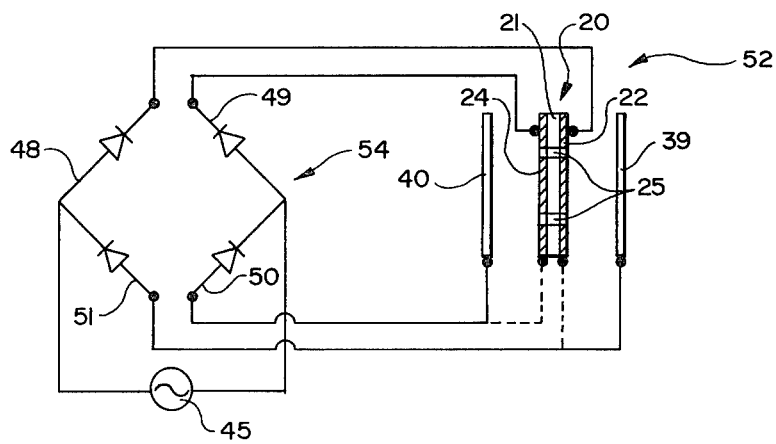
FIG. 11 is a schemmatic diagrammatic view similar to FIG. 10 illustrating in solid lines one slightly modified embodiment of the invention, and in dotted lines another modified embodiment; and, FIG. 12 is a diagrammatic perspective view, partly in block-and-line form, here illustrating an exemplary system employing a direct current source for deburring one side—here the upper surface—of a perforate metal clad dielectric laminate which is being fed through the apparatus on a continuous basis in a horizontal orientation, thereby minimizing the effect of off-gasing at the points of electrochemical attack.

In those instances where it is desired to achieve the pulsing current effect described above in connection with FIG. 10 but, at the same time it is desired to concentrate current density and preferential attack at the edges of the clad surrounding the thru-hole perforations 25 using only a single conductive path extending through each thru-hole perforation, the bridge rectifier may take the exemplary form illustrated in the system 52 depicted in FIG. 11. Thus, as here shown, a bridge rectifier 54 is provided in which the branches 50, 51 are also split so that the cathodes 39, 40 are active only during alternate half cycles. Thus, the arrangement is such that during one-half cycle, direct current is conducted from branch 48 to anodic clad 22, then through the electrolyte solution (not shown) within the thru-hole perforations 25 to active cathode 40 and back to the alternating current source 45 via branch 50 of the bridge rectifier 46. During the next half cycle of operation, cathode 40 is inactive, cathode 39 is active, clad 22 is electrically isolated, and clad 24 is anodic with direct current flowing to clad 24 via bridge rectifier branch 49, through the electrolyte solution within the thru-hole perforations 25 to active cathode 39, and back to the alternating current source 45 via the bridge rectifier branch 51. As a result of this arrangement, not only are the benefits of current pulsing obtained but, in addition, the conductive current paths are constrained to extend through the thru-hole perforations, concentrating current density and preferential attack at the peripheral edges of the clad surface surrounding the thru-hole perforations 25 in the laminate 20.

Moreover, those skilled in the art will readily appreciate that the exemplary form of the invention shown in FIG. 11 permits of elimination of the cathodes 39, 40 altogether. Thus, as shown in dotted lines, it will be appreciated that branch 50 of the bridge rectifier 54 may be directly connected to conductive metal clad 24 on the perforate metal clad dielectric laminate 20, while branch 51 may be directly connected to metal clad 22. Thus, in this modified form of the invention, during one-half cycle when clad 22 is anodic, clad 24 is cathodic and current passes through the thru-hole perforations 25 in one direction preferentially attacking the peripheral edges of clad 22 surrounding the thru-hole perforations; yet, during the second half cycle when clad 24 is anodic, clad 22 is cathodic and current passes through the thru-hole perforations 25 in the opposite direction preferentially attacking the peripheral edges of clad 24 surrounding the thru-hole perforations.

Figure 12:
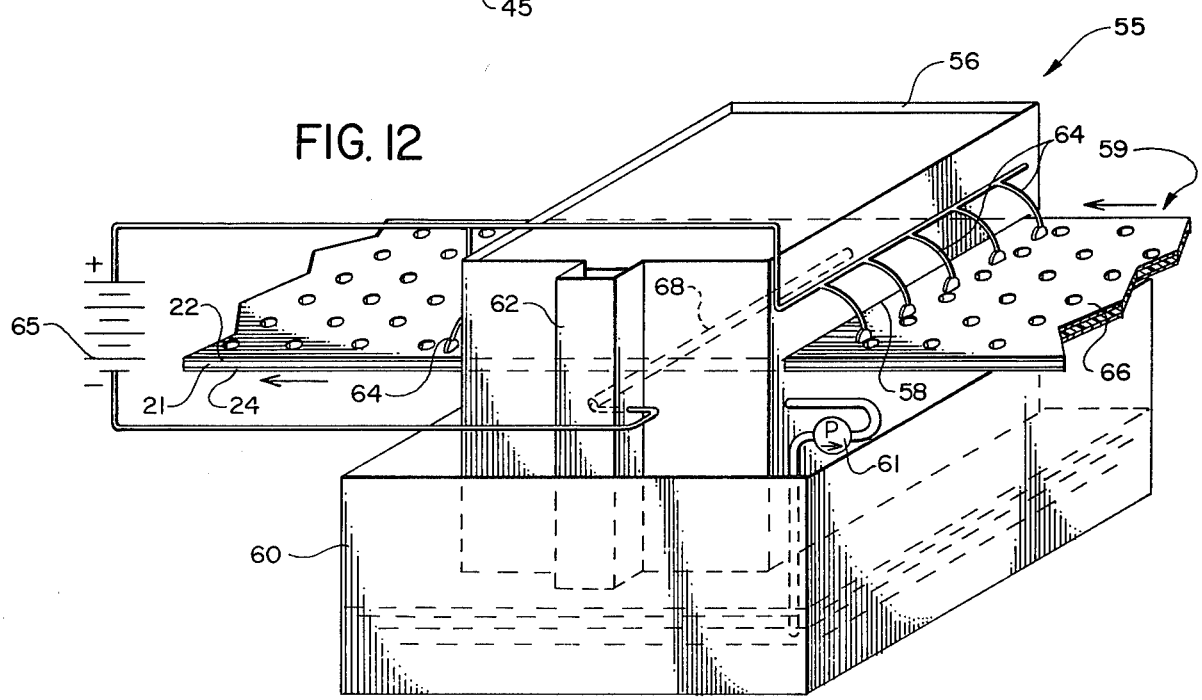

In all of the various exemplary forms of the invention herein described above, the systems have been illustrated as employing racks for positioning perforate metallic clad dielectric laminates 20 within an electrolyte solution in a vertical plane—i.e., in a plane wherein the thru-hole perforations extend horizontally. Consequently, such systems will generally require some air agitation means to prevent channeling of the gases involved at the sites of preferential attack and resulting grooving or scoring of the metal clad surface. However, those skilled in the art will appreciate that the present invention is not limited in any of its forms to arrangements wherein the perforate metallic clad dielectric laminates 20 must be vertically oriented. Thus, referring to FIG. 12, there has been illustrated yet another modified form of the invention, here comprising an electrochemical deburring system, generally indicated at 55, including a first tank 56 having slots 58 formed in two opposed sidewalls adapted to receive and permit passage of a continuous or elongate perforate metallic clad dielectric laminate sheet 59 which moves through the tank 56 in, for example, the direction indicated by the arrows. The slots 58 may be provided with suitable flexible wiping seals (not shown) so as to preclude or minimize leakage of electrolyte solution from the tank 56 through the slots. As here shown, tank 56 is mounted above an overflow tank 60 adapted to contain a reservoir of electrolyte solution, with such solution being continuously pumped from the overflow tank 60 to tank 56 by means of a conventional pump 61. Thus, as electrolyte solution is continuously pumped into tank 56, the solution is forced upwardly through the thru-hole perforations 25 in the horizontally oriented moving perforate metallic clad dielectric laminar sheet 59, with excess electrolyte solution being returned to the overflow tank 60 via an overflow return conduit 62.

In carrying out this exemplary form of the invention, the electrochemical deburring system 55 is, from an electrical standpoint, basically the same as the form of the invention shown in FIG. 9 and described above except that in this instance no switch actuators are necessary. Rather, a plurality of wiping-type electrical contacts 64 are provided which are electrically connected to the positive terminal of a suitable direct current power source such, for example, as a battery 65. Consequently, as the perforate metallic clad dielectric laminar sheet 59 passes through the tank 56, the uppermost metallic clad surface thereof, indicated at 66, is rendered anodic. A cathode 68 connected to the negative terminal of the direct current power source 65 extends transversely through tank 56 beneath the horizontally oriented moving laminar dielectric sheet 59. As a consequence of this arrangement, a single electrically conductive path is established extending through the electrolyte solution being forced upwardly through the thru-hole perforations 25 in sheet 59 between the anodic upper metallic clad surface 66 on sheet 59 and the cathode 68, thus concentrating current density and preferential attack at the peripheral edges of the metallic clad 66 surrounding the thru-hole perforations 25 on the upper surface of the moving sheet 59. The speed of sheet movement may be controlled by any conventional means (not shown) so as to ensure proper residence time of all portions of the sheet 59 within tank 56 as to effect adequate uniform deburring and rounding of the metallic clad 66 surrounding the thru-hole perforations. It should be noted that the flow and activity of the electrolyte solution may be enhanced by placing an ultrasonic transducer (not shown) inside tank 56.

As a direct consequence of the foregoing construction and the positive flow of electrolyte solution upwardly through the thru-hole perforations 25, the need for air agitation is eliminated or, at least, substantially reduced; and, the problems associated with channeling of gas evolved at the points of preferential attack is obviated. Since only the top side of the dielectric laminar sheet 59 is electrolized, and since the cathode is located beneath the dielectric laminar sheet, the conductive current paths established extend through the thru-hole perforations, thereby concentrating current density and preferential attack at the desired locations. In those instances where the dielectric laminar sheet 59 is clad on both sides of a centrally located dielectric lamination in a manner similar to that shown in FIG. 8, it is merely necessary to invert the sheet 59 and pass it through the system 55 a second time, thereby rendering the opposite metallic clad side of the sheet anodic and effectively deburring the opposite end of each thru-hole perforation.

Those skilled in the art will appreciate from the foregoing description that various forms of effective electrochemical deburring systems and equipment have herein been described which have peculiarly unique applicability in the deburring of printed wiring boards and similar perforate metallic clad dielectric laminates; and, which take advantage of the thru-hole perforations in such laminates to concentrate current density and preferential attack at the specific regions where deburring is desired—viz., the peripheral edges or lips of clad material surrounding the thru-hole perforations. For the most part, the exemplary systems are extremely simple and versatile; and can be readily used with perforate laminar metal clad dielectric sheets of virtually any size (within the constraining limits defined by the size of processing tanks) and/or cladding thicknesses. Further, the invention is equally applicable in its broadest aspects to processing of dielectric sheets clad on only one side or on both sides. Moreover, reracking of circuit boards is not required in order to effectively and uniformly deburr and round the peripheral edges of the metallic clads surrounding the opposite ends of such thru-hole perforations. And, such uniform smooth rounding or radiusing of such hole edges effectively minimizes the problems associated with "corner crack" failures.

What is claimed is:

1. The method of deburring a perforate metallic clad dielectric laminate having: (i) a non-conductive dielectric lamination; (ii) at least one conductive metallic clad lamination in face-to-face contact with the non-conductive dielectric lamination; and (iii), at least one thru-hole perforation extending through each of the conductive and non-conductive laminations; comprising the steps of:
   (a) immersing the laminate within a supply of electrolyte solution;
   (b) coupling one conductive metallic clad lamination on the dielectric laminate at a time to the positive terminal of a power source to render the one conductive metallic clad lamination anodic;
   (c) immersing cathode defining means in the supply of electrolyte solution with at least one cathode positioned on the side of the dielectric laminate opposite the one conductive anodic metallic clad lamination; and,
   (d) coupling the cathode defining means to the negative terminal of the power supply so as to complete a conductive path through the electrolyte solution between the anodic conductive metallic clad lamination and the at least one cathode with such conductive path extending through the thru-hole perforation(s) defined by the non-conductive dielectric lamination and by the conductive metallic clad lamination in the metallic clad dielectric laminate so as to minimize current density and electrochemical attack in that region of the thru-hole perforation(s) defined by the non-conductive dielectric lamination and to concentrate current density and preferential electrochemical attack at the peripheral edge of the conductive anodic metallic clad lamination surrounding the thru-hole perforation(s).

2. The method as set forth in claim 1 wherein the laminate is positioned in a horizontal plane within the supply of electrolyte solution.

3. The method as set forth in claim 2 wherein the metallic clad is formed on the upper surface of the laminate, and the cathode defining means is positioned below the laminate.

4. The method as set forth in claim 1 wherein two cathodes are simultaneously active and current density is in the range of about 160 amp/ft$^2$ and 200 amp/ft$^2$.

5. The method as set forth in claim 1 wherein two cathodes are simultaneously active and current density is on the order of 180 amp/ft$^2$.

6. The method as set forth in claim 1 wherein the electrolyte solution is maintained at a temperature ranging between about 120° F. and 135° F.

7. The method as set forth in claim 1 wherein the pH of the electrolyte solution is maintained near neutral.

8. The method as set forth in claim 1 wherein the pH of the electrolyte solution is maintained in a range between about 7.0 and 7.5.

9. The method as set forth in claim 1 wherein the electrolyte solution is maintained at a temperature ranging between about 120° F. and 135° F. and at a pH ranging between about 7.0 and 7.5.

10. The method as set forth in claim 1 wherein only one cathode is active at a time and current density is in the range of about 80 amp/ft$^2$ and 100 amp/ft$^2$.

11. The method as set forth in claim 1 wherein only one cathode is active at a time and current density is on the order of 90 amp/ft$^2$.

12. The method of deburring an elongate perforate metallic clad dielectric laminate having: (i) a non-conductive dielectric lamination; (ii) at least one conductive metallic clad lamination in face-to-face contact with the non-conductive dielectric lamination; and (iii), at least one thru-hole perforation extending through each of the conductive and non-conductive laminations; comprising the steps of:
   (a) progressively feeding the elongate laminate through a supply of electrolyte solution while maintaining the laminate in a horizontal plane with a conductive metallic clad lamination on the upper surface of the horizontal laminate;
   (b) coupling the conductive metallic clad lamination on the upper surface of the dielectric laminate to the positive terminal of a power source to render the upper conductive metallic clad lamination anodic;
   (c) positioning cathode defining means in the supply of electrolyte solution beneath the dielectric laminate; and,
   (d) coupling the cathode defining means to the negative terminal of the power supply so as to complete a conductive path through the electrolyte solution between the anodic conductive metallic clad lamination and the cathode defining means with such conductive path extending upwardly through the thru-hole perforation(s) defined by the non-conductive dielectric lamination and by the conductive metallic clad lamination(s) in the metallic clad dielectric laminate so as to minimize current density and electrochemical attack in that region of the thru-hole perforation(s) defined by the non-conductive dielectric lamination and to concentrate current density and preferential electrochemical attack at the upper peripheral edge of the conductive anodic metallic clad lamination surrounding the thru-hole perforation(s).

13. The method of deburring a perforate metallic clad dielectric laminate having: (i) a non-conductive dielectric lamination; (ii) first and second conductive metallic clads in face-to-face contact with, and formed on respective ones of the opposite surfaces of, the non-conductive dielectric lamination; and (iii), at least one thru-hole perforation extending through each of the conductive and non-conductive laminations; comprising the steps of:
   (a) immersing the laminate within a supply of electrolyte solution;
   (b) coupling one of the first and second conductive metallic clads on the dielectric laminate at a time to the positive terminal of a power source to render the one conductive metallic clad anodic;
   (c) immersing cathode defining means having first and second cathodes in the supply of electrolyte solution with the first cathode positioned on the side of the dielectric laminate opposite the first conductive metallic clad and the second cathode positioned on the side of the dielectric laminate opposite the second conductive metallic clad; and,
   (d) coupling the cathode defining means to the negative terminal of the power supply so as to complete a conductive path through the electrolyte solution between the anodic one of the first and second conductive metallic clads and at least the cathode on the opposite side of the dielectric laminate with such conductive path extending-through the thru-hole perforation(s) defined by the non-conductive dielectric lamination and by the first and second conductive metallic clads in the metallic clad dielectric laminate so as to minimize current density and electrochemical attack in that region of the thru-hole perforation(s) defined by the non-conductive dielectric lamination and to concentrate current density and preferential electrochemical attack at the peripheral edge of the conductive anode metallic clad surrounding the thru-hole perforation(s).

14. The method of deburring a perforate metallic clad dielectric laminate having: (i) a central non-conductive dielectric lamination; (ii) first and second conductive metallic clad laminations in face-to-face contact with respective ones of opposite faces of the central non-conductive dielectric lamination; and (iii), at least one thru-hole perforation extending through each of the conductive and non-conductive laminations; comprising the steps of:

(a) immersing the laminate within a supply of electrolyte solution;

(b) coupling one conductive metallic clad lamination on the dielectric laminate at a time to the positive terminal of a direct current power source to render the one conductive metallic clad lamination anodic;

(c) immersing first and second cathodes in the supply of electrolyte solution with the first and second cathodes positioned on opposite sides of the dielectric laminate;

(d) coupling the first and second cathodes to the negative terminal of the direct current power supply so as to complete first and second conductive paths through the electrolyte solution between the anodic conductive metallic clad lamination and each of the first and second cathodes with one such conductive path extending through the thru-hole perforation(s) defined by the non-conductive dielectric lamination and by the conductive metallic clad lamination(s) in the metallic clad dielectric laminate so as to minimize current density and electrochemical attack in that region of the thru-hole perforation(s) defined by the non-conductive dielectric lamination and to concentrate current density and preferential electrochemical attack at the peripheral edge of the conductive anodic metallic clad lamination surrounding the thru-hole perforation(s); and, (e) switching the coupling of the positive terminal between the first and second conductive metallic clad laminations so as to alternately render the first and second metallic clad laminations anodic and to alternately concentrate current density and preferential electrochemical attack at the peripheral edges of the first and second conductive anodic metallic clad laminations surrounding the thru-hole perforation(s).

15. The method as set forth in claim 14 including the further step of switching the coupling of the negative terminal between the second and first cathodes so as to render the second cathode active when the first conductive metallic clad lamination is anodic and the first cathode active when the second conductive metallic clad lamination is anodic.

16. (Second amended version of original claim 8) The method of deburring a perforate metallic clad dielectric laminate having: (i) a central non-conductive dielectric lamination; (ii) first and second conductive metallic clad laminations in face-to-face contact with respective ones of the opposite faces of the central non-conductive dielectric lamination; and (iii), at least one thru-hole perforation extending through each of the conductive and non-conductive laminations; comprising the steps of:

(a) immersing the laminate within a supply of electrolyte solution;

(b) rectifying the alternating current output from an alternating current power source with a rectifier bridge split to form two alternately energized direct current positive output terminals;

(c) coupling one positive output terminal of the split rectifier bridge to the first conductive metallic clad lamination to render such first clad lamination anodic during the first half of successive cycles of the alternating current power source;

(d) coupling the second positive output terminal of the split rectifier bridge to the second conductive metallic clad lamination to render such second clad lamination anodic during the second half of successive cycles of the alternating current power source;

(e) immersing first and second cathodes in the supply of electrolyte solution on respective opposite sides of the laminate;

(f) coupling the first and second cathodes to the negative terminal of the rectifier bridge so as to complete first and second conductive paths during the first half of successive cycles between the anodic first clad lamination and each of the first and second cathodes and third and fourth conductive paths during the second half of successive cycles between the anodic second clad lamination and each of the first and second cathodes and wherein one of the first and second conductive paths and one of the third and fourth conductive paths extend through each thru-hole perforation defined by the non-conductive dielectric lamination and by the first and second conductive metallic clad lamination in the metallic clad dielectric laminate so as to minimize current density and electrochemical attack in that region of the thru-hole perforation(s) defined by the non-conductive dielectric lamination and to alternately concentrate current density and preferential electrochemical attack at the peripheral edges of the first and second conductive anodic metallic clad laminations surrounding the thru-hole perforation(s).

17. The method of deburring a perforate metallic laminate having: (i) a central non-conductive dielectric lamination; (ii) first and second conductive metallic clad laminations in face-to-face contact with respective ones of the opposite faces of the non-conductive dielectric lamination; and (iii), at least one thru-hole perforation extending through each of the conductive and non-conductive laminations; comprising the steps of:

(a) immersing the laminate within a supply of electrolyte solution;

(b) rectifying the alternating current output from an alternating current power source with a rectifying bridge split to form two alternately energized direct current positive output terminals and two alternately energized negative terminals;

(c) coupling one positive output terminal of the split rectifier bridge to the first conductive metallic clad lamination to render such first clad lamination anodic during the first half of successive cycles of the alternating current power source;

(d) coupling the second positive output terminal of the split rectifier bridge to the second conductive metallic clad laminations to render such second clad lamination anodic during the second half of successive cycles of the alternating current power source;

(e) immersing first and second cathodes in the supply of electrolyte solution on respective opposite sides of the laminate;

(f) coupling the first and second cathodes to respective different ones of tne two negative terminals of the split rectifier bridge so as to complete a first conductive path during the first half of successive cycles between the anodic first clad lamination and the second cathode with such first path extending through-each thru-hole perforation and so as to complete a second conductive path during the second half of successive cycles between the anodic second clad lamination and the first cathode with the second conductive path extending through each thru-hole perforation defined by the non-conductive dielectric clad lamination and by the first and second conductive metallic clad laminations in the metallic clad dielectric laminate so as to minimize current density and electrochemical attack in that region of the thru-hole perforation(s) defined by the non-conductive dielectric lamination and to alternately concentrate current density and preferential electrochemical attack at the peripheral edges of the first and secon conductive anodic metallic clad laminations surrounding the thru-hole perforation(s).

18. The method of deburring a perforate metallic clad dielectric laminate of the type having a central non-conductive dielectric lamination and first and second conductive metallic clads formed on opposite sides of the central non-conductive dielectric lamination and having at least one thru-hole perforation extending through the laminate comprising the steps of:

(a) immersing the laminate within an electrolyte solution between a pair of spaced cathodes;

(b) alternately coupling the first and second conductive metallic clads on the laminate to the positive terminal of a power source to alternately render the first and second clads anodic;

(c) coupling the pair of spaced cathodes to the negative terminal of the power source on a simultaneous continuous coupled basis; and, (d) energizing the power source so as to create: (i) a first conductive path extending through each thru-hole perforation from the first metallic clad when the latter is anodic to one of the pair of cathodes; (ii) a second conductive path coincident in time with the first conductive path and extending from the first metallic clad to the other of the pair of cathodes; (iii) a third conductive path extending from the second metallic clad when the latter is anodic through each thru-hole perforation to the other of the cathodes; and (iv), a fourth conductive path coincident in time with the third conductive path and extending from the second metallic clad to the one of the pair of cathodes; so as to minimize current density and electrochemical attack in the region of the thru-hole perforation(s) defined by the non-conductive dielectric lamination and to alternately concentrate current density and preferential electrochemical attack at the peripheral edges of the first and second conductive metallic clads surrounding the thru-hole perforation(s) alternately during their anodic states.

19. The method as set forth in claim 18 wherein the power source comprises a direct current power source.

20. The method as set forth in claim 18 wherein the power source comprises a rectified alternating current power source.

21. The method as set forth in claim 18 wherein only one cathode is active at a time and current density is in the range of about 80 amp/ft$^2$ and 100 amp/ft$^2$.

22. The method as set forth in claim 18 wherein only one cathode is active at a time and current density is on the order of 90 amp/ft$^2$.

23. The method of deburring a perforate metallic clad dielectric laminate having a central non-conductive dielectric lamination and first and second conductive metallic clads respectively formed on opposite sides of the central non-conductive dielectric lamination and having at least one thru-hole perforation extending through the laminate comprising the steps of:

(a) immersing the laminate within a supply of electrolyte solution;

(b) coupling the first conductive metallic clad on the dielectric laminate to the positive terminal of a power source to render the first metallic clad anodic;

(c) immersing first and second cathodes in the electrolyte solution with the first and second cathodes respectively positioned on opposite sides of the dielectric laminate and respectively adjacent the first and second conductive metal clads;

(d) coupling the first and second cathodes to the negative terminal of the power supply so as to complete a first conductive path through the electrolyte solution between the anodic first metallic clad and the first cathode and a second conductive path extending through the electrolyte solution and through each thru-hole perforation between the anodic first metallic clad and the second cathode so as to minimize current density and electrochemical attack in the region of the thru-hole perforation(s) defined by the central non-conductive dielectric lamination and to concentrate current density and preferential electrochemical attack at the peripheral edge of the anodic first metalic clad surrounding one end of each thru-hole perforation; and, (e) switching the coupling of the positive terminal of the power source from the first metallic clad to the second metallic clad so as to (i) render the second metallic clad anodic, (ii) interrupt the first and second conductive paths, and (iii) complete a third conductive path through the electrolyte solution between the anodic second metallic clad and the second cathode and a fourth conductive path through the electrolyte solution and through each thru-hole perforation between the anodic second metallic clad and the first cathode so as to minimize current density and electrochemical attack in the region of the thru-hole perforation(s) defined by the central non-conductive dielectric lamination and to concentrate current density and preferential electrochemical attack at the peripheral edge of the anodic second metallic clad surrounding the opposite end of each thru-hole perforation.

24. The method as set forth in claims 18 or 23 wherein two cathodes are simultaneously active and current density is in the range of about 160 amp/ft$^2$ and 200 amp/ft$^2$.

25. The method as set forth in claims 18 or 23 wherein two cathodes are simultaneously active and current density is on the order of 180 amp/ft$^2$.

26. The method as set forth in claims 18 or 23 wherein the electrolyte solution is maintained at a temperature ranging between about 120° F. and 135° F.

27. The method as set forth in claim 18 or 23 wherein the pH of the electrolyte solution is maintained near neutral.

28. The method as set forth in claims 18 or 23 wherein the pH of the electrolyte solution is maintained in a range between about 7.0 and 7.5.

29. The method as set forth in claims 18 or 23 wherein the electrolyte solution is maintained at a temperature ranging between about 120° F. and 135° F. and at a pH ranging between about 7.0 and 7.5.

30. The method of deburring a perforate metallic clad dielectric laminate of the type having a central non-conductive dielectric lamination and first and second conductive metallic clads formed on opposite sides of the central non-conductive dielectric lamination and having at least one thru-hole perforation extending through the laminate comprising the steps of:
   (a) immersing the laminate within an electrolyte solution between a pair of spaced cathodes;
   (b) alternately coupling the first and second conductive metallic clads on the laminate to the positive terminal of a power source to alternately render the first and second clads anodic;
   (c) alternately coupling the pair of spaced cathodes to the negative terminal of the power source; and,
   (d) energizing the power source so as to create a first conductive path extending through each thru-hole perforation from the first metallic clad when the latter is anodic to one of the pair of cathodes and a second conductive path extending from the second metallic clad when the latter is anodic through each thru-hole perforation(s) defined by the non-conductive dielectric lamination and to alternately concentrate current density and preferential electrochemical attack at the peripheral edges of the first and second conductive metallic clads surrounding the thru-hole perforation(s) alternately during their aniodic states.

31. The method as set forth in claim 30 wherein the power source comprises a direct current power source.

32. The method as set forth in claim 30 wherein the power source comprises a rectified alternating current power source.

33. The method of deburring a perforate metallic clad dielectric laminate having a central dielectric lamination and first and second conductive metallic clads respectively formed on opposite sides of the central dielectric lamination and having at least one thru-hole perforation extending through the laminate comprising the steps of:
   (a) immersing the laminate within a supply of electrolyte solution;
   (b) coupling the first metallic clad on the dielectric laminate to the positive terminal of a power source to render the first metallic clad anodic;
   (c) immersing first and second cathodes in the electrolyte solution with the first and second cathodes respectively positioned on opposite sides of the dielectric laminate and respectively adjacent the first and second conductive metal clads;
   (d) coupling the second cathode to the negative terminal of the power supply so as to complete a first conductive path extending through the electrolyte solution and through each thru-hole perforation between the anodic first metallic clad and the second cathode so as to concentrate current density and preferential electrochemical attack at the peripheral edge of the anodic first metallic clad surrounding one end of each thru-hole perforation; and,
   (e) switching (i) the coupling between the positive terminal of the power source and the first metallic clad from the first metallic clad to the second metallic clad, and (ii) the coupling between the negative terminal of the power source and the second cathode from the second cathode to the first cathode, so as to complete a second conductive path through the electrolyte solution and through each thru-hole perforation between the anodic second metallic clad and the first cathode so as to concentrate current density and preferential electrochemical attack at the peripheral edge of the anodic second metallic clad surrounding the opposite end of each thru-hole perforation.

34. The method of deburring a perforate metallic clad dielectric laminate of the type having a central dielectric lamination and first and second conductive metallic clads formed on opposite sides of the central dielectric lamination and having at least one thru-hole perforation extending through the laminate comprising the steps of:
   (a) immersing the laminate within an electrolyte solution;
   (b) coupling the first and second conductive metallic clads to respective different ones of the terminals of an alternating current power source; and,
   (c) energizing the alternating current power source so that one of the first and second clads is initially anodic while the other of the first and second clads is initially cathodic and wherein the anodic/cathodic states of the first and second clads are rapidly alternated so as to provide an alternating current flow path through each thru-hole perforation in the dielectric laminate for concentrating current density and preferentially electrochemically attacking the anodic clad surrounding the peripheral edges of each thru-hole perforation with the first and second clads being preferentially attacked alternately during their anodic states.

35. The method as set forth in claims 33 or 34 wherein the electrolyte solution is maintained at a temperature ranging between about 120° F. and 135° F.

36. The method as set forth in claims 33 or 34 wherein the pH of the electrolyte solution is maintained near neutral.

37. The method as set forth in claims 33 or 34 wherein the pH of the electrolyte solution is maintained in a range between about 7.0 and 7.5.

38. The method as set forth in claims 33 or 34 wherein the electrolyte solution is maintained at a temperature ranging between about 120° F. and 135° F. and at a pH ranging between about 7b 7.0 and 7.5.

39. The method as set forth in claims 33 or 34 wherein only one cathode is active at a time and current density is in the range of about 80 amp/ft$^2$ and 100 amp/ft$^2$.

40. The method as set forth in claims 33 or 34 wherein only one cathode is active at a time and current density is on the order of 90 amp/ft$^2$.

41. Apparatus for electrochemically deburring perforate metallic clad dielectric laminates of the type having a first lamination formed of non-conductive dielectric material, at least one second lamination formed of conductive metallic clad, and at least one thru-hole perforation extending through the laminate comprising, in combination:
(a) tank means for containing an electrolyte solution;
(b) a power source having positive and negative terminals;
(c) means for positioning n perforate metallic clad dielectric laminates, where "n" is any whole integer, within the electrolyte solution is said tank means;
(d) means for coupling one metallic clad lamination on each of said n laminates to said positive terminal for rendering said coupled clad anodic; and,
(e) cathode defining means coupled to said negative terminal and including at least one cathode disposed on the side of each of the n perforate metallic clad dielectric laminates remote from said anodic metallic clad and with the dielectric lamination of the n laminates interposed therebetween so as to establish a conductive path extending through each perforation in the n perforate metallic clad dielectric laminates between said cathode defining means and the peripheral edge of said anodic clad surrounding each of the peforations in said n laminates so as to minimize current density and electrochemical attack in the region of the thru-hole perforation(s) defined by said non-conductive dielectric first lamination and to concentrate current density and preferential electrochemical attack at said peripheral edge.

42. Apparatus as set forth in claim 41 wherein said power source is a direct current power source.

43. Apparatus as set forth in claim 41 wherein said power source is a rectified alternating current power source.

44. Apparatus for electrochemically deburring perforate metallic clad dielectric laminates of the type having a first central lamination formed of non-conductive dielectric material, first and second conductive metallic clads respectively formed on opposite sides of said central non-conductive dielectric lamination, and at least one thru-hole perforation extending through the laminate, comprising, in combination:
(a) tank means for containing an electrolyte solution;
(b) a power source having positive and negative terminals;
(c) means for positioning n perforate metallic clad dielectric laminates, where "n" is any whole integer, within the electrolyte solution in said tank means;
(d) means for coupling said first conductive metallic clad on each of said n laminates to said positive terminal for rendering said first clad anodic;
(e) first and second cathode defining means respectively positioned within the electrolyte solution in said tank means on opposite sides of each of then perforate metallic clad dielectric laminates with said first cathode defining means positioned adjacent said n first conductive metallic clads and said second cathode defining means positioned adjacent said n second conductive metallic clads;
(f) means for coupling said first and second cathode defining means to said negative terminal; and,
(g) switch means for switching the coupling between said positive terminal and said first metallic clad on each of said n laminates from said first clad to said second clad on each of said n laminates to render said second clad anodic whereby said first and second clads are alternately anodic so as to alternately complete a first conductive path from said first metallic clad when in the anodic state through said electrolyte solution and each of the thru-hole perforations to said second cathode defining means and a second conductive path from said second metallic clad when in the anodic state through said electrolyte solution and each of the thru-hole perforations to said first cathode defining means so as to minimize current density and electrochemical attack in the region of the thru-hole perforation(s) defined by said non-conductive dielectric first lamination and to alternately concentrate current density and preferential electrochemical attack at the peripheral edges of said first and second clads surrounding each of the thru-hole perforations when said first and second clas are in the anodic state.

45. Apparatus as set forth in claim 44 wherein said means for coupling said first and second cathode defining means to said negative terminal comprise second switch means for alternately coupling said first and second cathode defining means to said negative terminal with said second switch means synchronized with said first switch means for switching the coupling between said positive terminal and said first and second metallic clads so as to render said second cathode defining means active when said first clad is anodic and said first cathode defining means active when said second clad is anodic.

46. Apparatus as set forth in claim 44 wherein said power source comprises an alternating current power source and said switch means comprises a split bridge rectifier having a negative terminal and a pair of alternately energized direct current positive output terminals with said positive output terminals respectively connected to said first and second metallic clads so as to render said first metallic clad anodic during the first half of each successive alternating current cycle and to render said second metallic clad anodic during the second half of each successive alternating current cycle.

47. Apparatus as set forth in claim 44 wherein said power source comprises an alternating current power source and said switch means comprise a split bridge rectifier including a pair of negative terminals respectively connected to said first and second cathode defining means and a pair of alternately energized direct current positive output terminals respectively connected to said first and second metallic clads so as to render said first metallic clad anodic and said second cathode defining means active during the first half of each successive alternating current cycle and to render said second metallic clad anodic and said first cathode defining means active during the second half of each successive alternating current cycle.

48. Apparatus as set forth in claim 44 wherein said power source is a direct current power source.

49. Apparatus as set forth in claim 44 wherein said power source is a rectified alternating current power source.

50. Apparatus for electrochemically deburring perforate metallic clad dielectric laminates comprising, in combination:
(a) tank means for containing an electrolyte solution;
(b) a power source having positive and negative terminals;
(c) rack means for releasably clamping n perforate metallic clad dielectric laminates where "n" is any whole integer, said rack means including conductor means for coupling a single conductive metallic clad lamination on each of said n laminates to said positive terminal of said power source for rendering said coupled conductive metallic clad anodic, said rack means and said n perforate metallic clad dielectric laminates releasably clamped thereto being immersible in the electrolyte solution contained within said tank means; and, (d) cathode defining means coupled to said negative terminal and including at least one cathode disposed on the side of each of the n perforate metallic clad dielectric laminates remote from said anodic metallic clad and with the dielectric lamination of each laminate interposed therebetween so as to establish a conductive path extending through each perforation in the n perforate metallic clad dielectric laminates between said cathode defining means and the peripheral edge of said anodic clad surrounding each of the perforations in said n laminates so as to concentrate current density and preferential electrochemical attack at said peripheral edge(s).

51. Apparatus as set forth in claim 50 wherein said power source is a direct current power source.

52. Apparatus as set forth in claim 50 wherein said power source is a rectified alternating current power source.

53. Apparatus for electrochemically deburring perforate metallic clad dielectric laminates of the type having a first central lamination formed of non-conductive dielectric material, first and second conductive metallic clads respectively formed on opposite sides of said central non-conductive dielectric lamination, and at least one thru-hole perforation extending through the laminate, comprising, in combination:

(a) tank means for containing an electrolyte solution;

(b) a power source having positive and negative terminals;

(c) rack means for releasably clamping n perforate metallic clad dielectric laminates where n is any whole integer, said rack means including; (i) an electrical insulating spacer; (ii) first and second conductor means secured to and spaced apart by said insulating spacer; and (iii), n pairs of conductive mounting clips with one clip in each of said n pairs secured to and in electrical contact with said first conductor means and the other clip in each of said pairs secured to and in electrical contact with said second conductor means and with each of said n pairs of clips defining a nip for receiving one of said n laminates and releasably clamping the same to said rack means so that an anodic conductive path is completed through said first conductor means and one of said clips in each of said n pairs to said first metallic clads on each of said n laminates and an anodic conductive path is established through said second conductor means and the other of said clips in each of said n pairs to said second metallic clads on each of said n laminates, said rack means and said n perforate metallic clad dielectric laminates releasably clamped thereto being immersible in the electrolyte solution contained within said tank means;

(d) switch means for alternately coupling said first and second conductor means to said positive terminal for alternately rendering said first and second metallic clads anodic;

(e) first and second cathode defining means respectively positioned within the electrolyte solution in said tank means on opposite sides of each of the n perforate metallic clad dielectric laminates with said first cathode defining means positioned adjacent said n first conductive metallic clads and said second cathode defining means positioned adjacent said n second conductive metallic clads; and, (f) means for coupling said first and second cathode defining means to said negative terminal whereby when said switch means are positioned to render said first metallic clad anodic, a first conductive path is established from said first metallic clad through said electrolyte solution and each of the thru-hole perforations to said second cathode defining means and when said switch means is positioned to render said second metallic clad anodic, a second conductive path is established from said second metallic clad through said electrolyte solution and each of the thru-hole perforations to said first cathode defining means so as to alternately concentrate current density and preferential electrochemical attack at the peripheral edges of said first and second clads surrounding each of the thru-hole perforations when said first and second clads are in the anodic state.

54. Apparatus as set forth in claim 53 wherein said means for coupling said first and second cathode defining means to said negative terminal comprise second switch means for alternately coupling said first and second cathode defining means to said negative terminal with said second switch means synchronized with said first switch means for switching the coupling between said positive terminal and said first and second metallic clads so as to render said second cathode defining means active when said first clad is anodic and said first cathode defining means active when said second clad is anodic.

55. Apparatus as set forth in claim 53 wherein said power source comprises an alternating current power source and said switch means comprises a split bridge rectifier having a negative terminal and a pair of alternately energized direct current positive output terminals with said positive output terminals respectively connected to said first and second metallic clads so as to render said first metallic clad anodic during the first half of each successive alternating current cycle and to render said second metallic clad anodic during the second half of each successive alternating current cycle.

56. Apparatus as set forth in claim 44 wherein said power source comprises an alternating current power source and said switch means comprise a split bridge rectifier including a pair of negative terminals respectively connected to said first and second cathode defining means and a pair of alternately energized direct current positive output terminals respectively connected to said first and second metallic clads so as to render said first metallic clad anodic and said second cathode defining means active during the first half of each successive alternating current cycle and to render said second metallic clad anodic and said first cathode defining means active during the second half of each successive alternating current cycle.

57. Apparatus as set forth in claim 53 wherein said power source is a direct current power source.

58. Apparatus as set forth in claim 53 wherein said power source is a rectified alternating current power source.

59. Apparatus for electrochemically deburring perforate metallic clad dielectric laminates of the type having a first lamination formed of non-conductive dielectric material, at least one second lamination formed of conductive metallic clad, and at least one thru-hole perforation extending through the laminate comprising, in combination:

(a) tank means for containing an electrolyte solution;
(b) a power source having positive and negative terminals;
(c) means for positioning n perforate metallic clad dielectric laminates, where "n" is any whole integer, within the electrolyte solution in said tank means;
(d) means for coupling one metallic clad lamination on each of said n laminates to said positive terminal for rendering said coupled clad anodic; and,
(e) cathode defining means coupled to said negative terminal and including at least one cathode disposed on the side of each of the n perforate metallic clad dielectric laminates remote from said anodic metallic clad and with the dielectric lamination of the n laminates interposed therebetween so as to establish a conductive path extending through each perforation in the n perforate metallic clad dielectric laminates between said cathode defining means and the peripheral edge of said anodic clad surrounding each of the perforations in said n laminates so as to minimize current density and electrochemical attack in the region of the thru-hole perforations defined by said non-conductive dielectric first lamination and to concentrate current density and preferential electrochemical attack at said peripheral edge; said means for positioning said n perforate metallic clad dielectric laminates within the electrolyte solution in said tank means, including means for progressively moving said n laminates through said tank means in a horizontal plane with said second lamination of conductive metallic clad comprising the upper horizontal surface of said n laminates and said cathode defining means are positioned within said tank means beneath said horizontal n laminates so that gases evolved at the site(s) of preferential electrochemical attack are free to move upwardly through said electrolyte solution and away from said n laminates without causing channeling thereof.

60. Apparatus as set forth in claim 59 wherein means are provided for circulating said electrolyte solution and causing said solution to move upwardly through the thru-hole perforation(s) in said n laminates during electrochemical deburring thereof.

61. Apparatus as set forth in claims 59 or 60 further including an ultrasonic transducer mounted within said tank means.

62. Apparatus for electrochemically deburring perforate metallic clad dielectric laminates of the type having a first central lamination formed of non-conductive dielectric material, first and second conductive metallic clads respectively formed on opposite sides of said central non-conductive dielectric lamination, and at least one thru-hole perforation extending through the laminate, comprising, in combination:

(a) tank means for containing an electrolyte solution;
(b) an alternating current power source;
(c) rectifying means for converting alternating current to direct current, said rectifying means including first and second electrically isolated negative terminals coupled to said alternating current power source and first and second alternately energized electrically isolated positive output terminals connected to said alternating current power source so that during the first half of each alternating current cycle current is conducted through said first positive and said second negative terminals and during the second half of each alternating current cycle current is conducted through said second positive and said first negative terminals;
(d) means for immersing said laminate in the electrolyte solution in said tank means; and,
(e) means for connecting each of said first positive and negative terminals to said first conductive metallic clad and each of said second positive and negative terminals to said second conductive metallic clad so that during the first half of each alternating current cycle said first clad is anodic and said second clad is cathodic and during the second half of each alternating current cycle said second clad is anodic and said first clad is cathodic so as to establish a reversible pulsating interanodic/cathodic conductive path extending through each thru-hole perforation and so as to be alternately concentrate current density and preferential electrochemical attack at the peripheral edges of said first and second clads surrounding each of the thru-hole perforations when said first and second clads are in the anodic state.

63. A rack for supporting perforate metallic clad dielectric laminates having first and second conductive metallic clads formed on a central dielectric lamination in an electrolyte solution between a pair of spaced cathodes during an anodic electrochemical deburring process, said rack comprising, in combination: first and second spaced generally parallel conductors adapted to be alternately connected to the positive terminal of a direct current power source; an insulator secured to and interposed between said first and second conductors for electrically isolating said first and second conductors with respect to one another; and, n pair of conductive metal clips, where n is any whole integer, secured to said first and second conductors; with one clip in each pair secured to said first conductor and the other clip in each pair secured to said second conductor and with each pair of clips defining a nip for receiving and releasably supporting the metallic clad dielectric laminate in a plane coincident with said insulator; whereby first and second electrically isolated current paths are established through respective ones of said first and second conductors and said conductive metal clips to the first and second conductive metallic clads on the dielectric laminate for alternately rendering said first and second clads anodic.

64. A rack as set forth in claim 63, wherein said n pair of conductive metal clips are formed of spring-like material for releasably clamping said laminate by spring action.

* * * * *